(12) United States Patent
Sherred

(10) Patent No.: US 8,549,367 B1
(45) Date of Patent: Oct. 1, 2013

(54) METHOD AND SYSTEM FOR ACCELERATING MEMORY RANDOMIZATION

(75) Inventor: Mark A. Sherred, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 249 days.

(21) Appl. No.: 12/981,111

(22) Filed: Dec. 29, 2010

(51) Int. Cl.
*G11C 29/00* (2006.01)

(52) U.S. Cl.
USPC ........... 714/718; 714/719; 714/721; 714/722; 713/189; 713/190; 380/2

(58) Field of Classification Search
USPC ................. 713/1, 2, 189–190, 300, 330, 340; 365/145, 230.03, 203; 702/85, 89; 714/718–723; 380/2
See application file for complete search history.

(56) References Cited

U.S. PATENT DOCUMENTS

| | | | | |
|---|---|---|---|---|
| 4,369,511 A * | 1/1983 | Kimura et al. | | 714/719 |
| 4,821,238 A * | 4/1989 | Tatematsu | | 365/201 |
| 6,161,206 A * | 12/2000 | Wasson | | 714/738 |
| 6,490,357 B1 * | 12/2002 | Rose | | 380/265 |
| 7,076,667 B1 * | 7/2006 | Gama et al. | | 713/193 |
| 7,353,400 B1 * | 4/2008 | Folmsbee | | 713/190 |
| 7,764,792 B1 * | 7/2010 | Avivi et al. | | 380/255 |
| 7,929,692 B2 * | 4/2011 | Kim et al. | | 380/44 |
| 7,949,912 B1 * | 5/2011 | Trimberger | | 714/722 |
| 2002/0013884 A1 * | 1/2002 | Fujioka | | 711/115 |
| 2002/0087436 A1 * | 7/2002 | Guthrie et al. | | 705/28 |
| 2005/0108498 A1 * | 5/2005 | Kaminaga et al. | | 711/209 |
| 2007/0124811 A1 * | 5/2007 | Dellow et al. | | 726/9 |
| 2008/0013720 A1 * | 1/2008 | Degele | | 380/43 |
| 2008/0155273 A1 * | 6/2008 | Conti | | 713/190 |
| 2008/0307240 A1 * | 12/2008 | Dahan et al. | | 713/320 |
| 2009/0287956 A1 * | 11/2009 | Flynn et al. | | 714/6 |

* cited by examiner

*Primary Examiner* — David Lazaro
*Assistant Examiner* — Sarah Drabik
(74) *Attorney, Agent, or Firm* — Dickstein Shapiro LLP

(57) ABSTRACT

A method and system for randomizing memory in a functional verification test of a user design is disclosed. A random number is generated during the functional verification test. The data stored in the memory of the user design is stored. Encryption keys unique for each memory address of the memory are generated. Each encryption key for each memory address is a function of the random number and the memory address. Data in each memory address of the memory is encrypted with the encryption keys unique for each memory address. After exiting a low-power or power-off state, data in each memory address is read and decrypted using the same encryption keys. Data before and after the low-power or power-off state are compared to test memory loss.

24 Claims, 1 Drawing Sheet

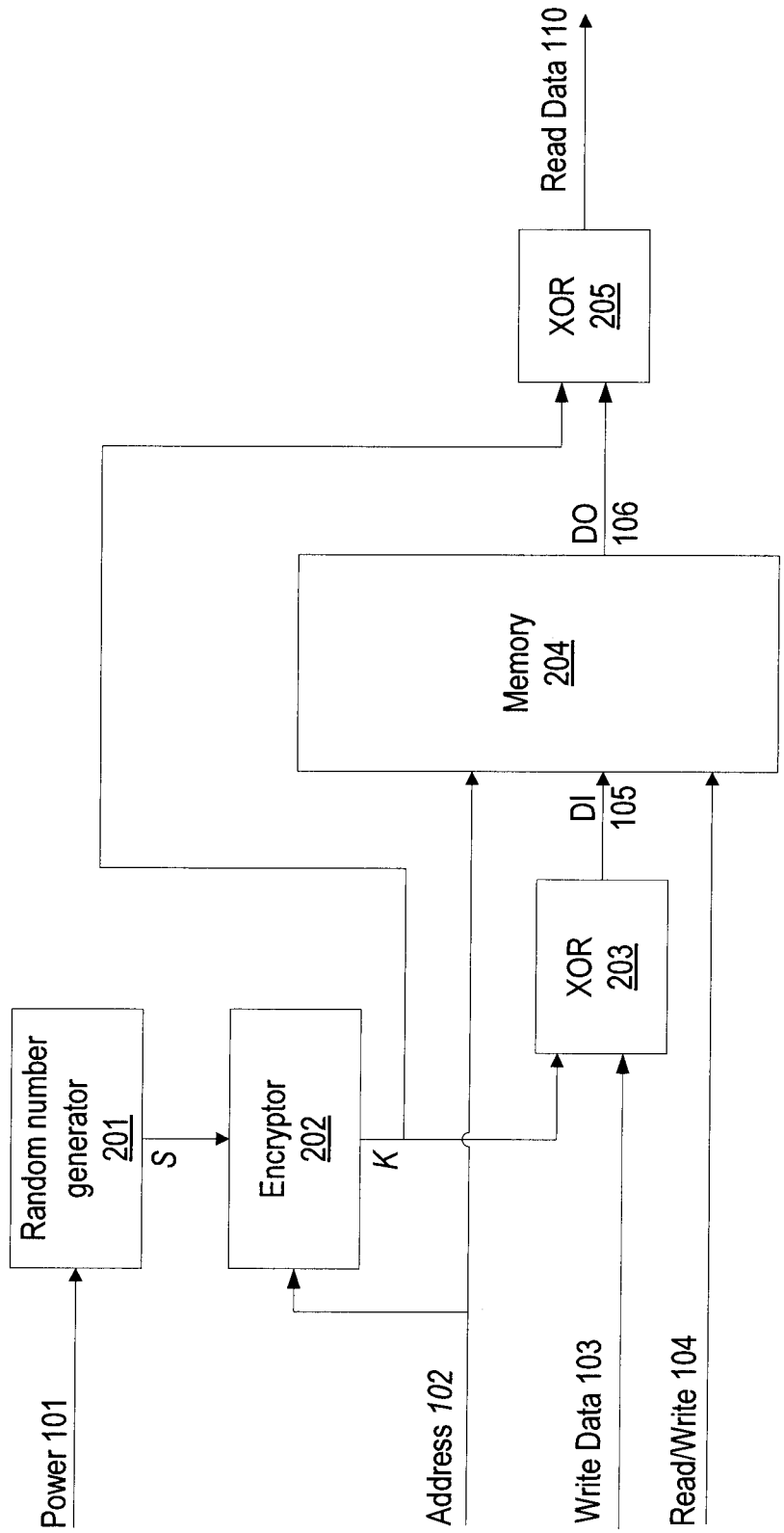

METHOD AND SYSTEM FOR ACCELERATING MEMORY RANDOMIZATION

FIELD

The field of the invention relates generally to hardware and software verification of logic circuits and more particularly relates to a method and system for accelerating memory randomization in a functional verification test of a user design.

BACKGROUND

When emulating a user design for verifying low-power performance, memories in the user design are loaded with a pseudo-random pattern. Those memories loaded with the pseudo-random pattern are used either to test permanent data loss when the memory is power cycled, or to test memory read/write functions in a low-power state. The power domain in the user design that drives the memory read/write functions changes the power state not only during the initialization but also while the user design is running.

When the user design is emulated with a dynamic target (e.g., external logic analyzer) in a logic analyzer (LA) mode, test clocks cannot be paused once they start, and the emulation must run through until it reaches a breakpoint. Therefore, memories in a user design need to be randomized within the emulator while the user design is running.

When emulating without a dynamic target, for example in synthesizable test bench (STB) mode, the emulator detects changes in the power state and pauses the emulation by stopping the emulation clock. During the pause, the software running in the host workstation downloads a random pattern into the memory, and restarts the emulation clock to resume the emulation.

The memory read functionality of the user design in a low-power state is tested by reading and storing the original memory content, loading a random pattern to the memory, and writing the stored memory contents back to the memory when full power is restored. The memory content written in the full power state is compared with those read in the lower power state to verify that the memory read failed during the low-power state.

However, the emulation with a dynamic target such as a logic analyzer cannot be run in a STB mode because the emulation run typically cannot be paused once started. Other solutions have been proposed to overcome this problem. However, there is currently no known solution for emulating a user design in a logic analyzer (LA) mode without containing a state machine for randomizing memory during the emulation.

Memory randomization in a STB mode is functional but slow because the emulation repeatedly stops and resumes. The pause/resume functions are performed by a host workstation require interruption each time the emulation stops and restarts. Many STB mode approaches also require an emulation clock per each memory location. The memory in a user design that needs to be randomized and written during emulation may have billions of locations. In addition, the emulation clock cycles need to be visible to the user design during the emulation for memory randomization. In a typical circuit design, the emulation clocks are not visible and some user designs can only provide limited visibility of their emulation clocks for memory randomization and testing.

The present invention overcomes the above-identified shortcomings of prior art memory randomization techniques and provides benefits and solutions for efficient randomization and testing of a memory in a user design during an emulation.

SUMMARY

A method and system for randomizing memory in a functional verification test of a user design is disclosed. A random number is generated during the functional verification test. The data stored in the memory of the user design is stored. Encryption keys unique for each memory address of the memory are generated. Each encryption key for each memory address is a function of the random number and the memory address. Data in each memory address of the memory is encrypted with the encryption keys unique for each memory address. After exiting a low-power or power-off state, data in each memory address is read and decrypted using the same encryption keys. Data before and after the low-power or power-off state are compared to test memory loss.

It is an objective of the present invention to model loss of information stored in a memory when one or more power domains in a user design are turned off or run in a low-power state.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

FIG. 1 illustrates a schematic for reading a memory with single read/write port, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and system for randomizing memory in a functional verification test of a user design is disclosed. A random number is generated during the functional verification test. The data stored in the memory of the user design is stored. Encryption keys unique for each memory address of the memory are generated. Each encryption key for each memory address is a function of the random number and the memory address. Data in each memory address of the memory is encrypted with the encryption keys unique for each memory address. After exiting a low-power or power-off state, data in each memory address is read and decrypted using the same encryption keys. Data before and after the low-power or power-off state are compared to test memory loss.

Each of the features and teachings disclosed herein can be utilized separately or in conjunction with other features and teachings to provide a method for accelerating memory randomization in a functional verification test of a user design. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems, design verification systems such as a hardware emulator, simulator, and hardware-accelerated simulator systems, or testers providing scan inputs to such design verification systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present teachings may be applied in a commercially available hardware-based emulation system, a logic simulator, or any other logic simulator if two-state simulation (0 and 1 only) is run instead of a simulation with an X (unknown) value.

According to one embodiment, an encryption key is used to provide random patterns to the memory in a user design. The data written into the memory is encoded with the key, and the data read out from the memory is decoded with the same key. In one embodiment, a separate encoding and decoding key pair may be provided to work together. The memory may have more than one write port and more than one read port. All ports use the same random number S, but they are encrypted with different functions $f(A,S)$ because they have different memory address A.

Each time memory is randomized, only the key is changed instead of respectively changing each memory location. The data read back from the memory appears random unless it is decoded with the same key. The encoding essentially encrypts the data, but the encoding/decoding in accordance with the present technique is intended to efficiently create random gibberish in memory, not to hide and recover a message.

In one embodiment, encryption key K is a vector function $f(A,S)$ of memory address A and a random number S. For a known memory address A, the encryption key K changes as the random number S changes. In one embodiment, a new random number S is generated in a single emulation cycle with a linear feedback shift register (LFSR). This eliminates state machines required for each memory location for randomizing the memory.

According to one embodiment, encryption key K is generated by XOR'ing address A with random number S. Random number S may be shared for all memories in the power domain, or each memory may have its own local random number S. Random number S may be a vector applied to one or more memory locations. In this case, partial or entire bits of address A are XOR'ed with partial or selected bits of vector S to generate the encryption key K.

In another embodiment, a key generation algorithm is applied to selectively invert bits in the random number S (i.e., XOR) using bits of address A. For example, if bit A[0] is one, bits S[0], S[5], and S[11] are inverted. If bit A[1] is one, bits S[1], S[4], S[11] are inverted. Each set of inversions feeds into the next inversions. If bits A[0] and A[1] are both one, S[11] is inverted twice. Some bits of address A may be used to select bits of S, and other bits of A may again invert those selected bits. If address A is wider than the memory, for instance for 1 bit wide memories, some bits in address A may be used to select a bit from S. The remaining bits in address A are XOR'ed together to generate a random bit. This random bit is XOR'ed with the selected bit from S to generate the encryption key K.

The application of an encryption key K for randomizing memory is illustrated in the following example. The random number S is initially set to S1, and the encryption key $f(A, S1)$ is generated. Suppose that the original data stored in the memory location A is D1. The original data DI is overwritten with new data by bitwise XOR operation of the original data with the encryption key $f(A, S1)$. After the XOR operation, new data DI XOR $f(A,S1)$ is stored in the memory location A.

When the data is read back from the memory address A, a second XOR with the same key $f(A,S1)$ is operated on the stored data DI XOR $f(A,S1)$ to produce a data out DO. The XOR operator has the following characteristics for any values or vectors of x, y and z:

$$x \text{ XOR } x = 0;$$

$$x \text{ XOR } 0 = x;$$

$$x \text{ XOR } (y \text{ XOR } z) = (x \text{ XOR } y) \text{ XOR } z.$$

Therefore, the data out DO is the same as the original data DI because the following relationship holds between the original data DI in and the data out DO:

$$DO = [DI XOR f(A, S1)] XOR\ f(A, S1) = DI XOR [f(A, S1)] XOR f(A, S1)$$

$$= DI XOR 0 = DI.$$

To provide another random pattern to the memory address A, a new random number S2 is used to generate another encryption key $f(A,S1)$. The data out DO read from the same memory address A using the new encryption key $f(A,S2)$ is now:

$$DO=[DI \text{ XOR } f(A,S1)] \text{ XOR } f(A,S2)=D1 \text{ XOR}[f(A,S1) \text{ XOR } f(A,S2)].$$

Since the key generated with S1 and S2 are different, the second operator $f(A,S1)$ XOR $f(A, S2)$ is effectively a new random pattern. The decryption of the original data DI with this random number S2 makes DO to appear random.

The original data DI data in a memory address A is encoded using the encryption key K before being written to the memory address A in the write port. Content from the memory address A is read out by the read port. The current key K is used to decode the data read out DO. The data read out DO is compared with the original data DI.

For example, the original data DI and data read out DO are a vector of 32 bits. The encryption key K has the same number of bits. When encoding, the bit in DI is flipped if the corresponding bit in the key K is one; it remains changed if the corresponding bit in the key K is zero. Decoding occurs in the same manner by bit-wise flipping based on the key K. If the original data bit in DI and the corresponding bit in the key K were one, the encoded bit in the memory is zero. If the same key K is used for decoding, the bit in the memory is inverted back to the original state, one. If different keys K are used for encoding and decoding, for example, when the random number S is changed from S1 to S2, the original data would not be obtained.

If only the random number S was used instead of the encryption key K that is a function of the memory address A and random number S as discussed in the above examples, all memory locations containing the same data before randomization would have the same random value every time the random number S changes. For example, the data stored to the memory address A after the XOR operation with the random number S is DI XOR S1. After a different random number S2 is applied, the data out DO is:

$$DO=(DI \text{ XOR } S1) \text{ XOR } S2=DI \text{ XOR } (S1 \text{ XOR } S2).$$

This is effectively same as applying a third random number S3=S1 XOR S2. However, the data out does not vary with the memory location A. Multiple memory locations containing the same data will continue to have matching data after repeated randomization. These values will change with each randomization, but they will all have the same new value, therefore an efficient randomization is not achieved.

If only a random number S is used for randomization instead of an encryption key K, every memory is effectively randomized with the same key K. For example, the memory is filled with zeros (00B), a random number S=10B is used, these memory locations will be written with the value XOR (00B, 10B)=10B. In the next step, S changes to a new random value, say 01B. If the whole memory is read out after the second randomization, all the location set to zero will all be read as XOR (10B, 01B)=11B. The problem is that all of the memory locations will appear to change to the same random value. However, with the encryption key K=$f(A,S)$, a unique key is used for each memory location A, or at least different keys are used for nearby memory addresses.

The encryption key K of a vector function $f(A,S)$ generates a different value for each memory address A. The vector function may be a random number generator that receives A and S as its seeds. A simple function that permutes a random number S on the memory address A may be used for certain applications.

According to one embodiment, the random number S has a different width from the data DI or DO. The vector function $f(A, S)$ outputs a vector of the same width as the data DI and DO. The random number S is typically 8 to 128 bit wide. For example, the random number S is 64 bit whereas DI and DO are 16 bit long. A single random number S may be used for all memory addresses in the same power domain, or a unique random number S may be used for each memory address. When a single random number S is used for all memory locations in the power domain, each memory may be randomized with selected bits from S.

According to one embodiment, the vector function $f(A, S)$ uses the memory address A to select different sets of bits from the random number S. The series of random numbers S1, S2, ... Sn may be selected from different sets of bits from the random number S. If the memory is 8 bit wide, and S is 64 bit wide, some bits of A would be used to select a set of 8 bits from S to generate an encryption key K. In this case, the random number S has 8 sets of 8 bits. The bits in S may be used in multiple sets and in multiple orders to select an arrangement of 8 bits from S. The vector function $f(A, S)$ may select, invert, shift and/or rotate bits in S based on bits in memory address A or select, invert, shift and/or rotate bits in memory address A based on the selected set of bits from S.

A memory read test is performed with one of the above-described vector functions providing random patterns to the memory. A copy of a random number S1 is kept before switching to another random number S2. After the low-power condition ends and full power is restored, the random number S is set back to S1.

The memory tested for read/write in low-power conditions is part of a larger circuit being tested. For example, the memory might be the display memory for a mobile phone. When the phone is not in use, the memory is powered off or enters into a low-power state to save battery. When the phone wakes up by the user's action of hitting a button or an incoming call, it needs to reload the graphical data into the display memory. When testing to see if this operation is done correctly, the phone is modeled in emulation, simulation, or hardware-accelerated in-circuit simulation. Using the Cadence Common Power Format (CPF) or similar, the power control signals for each power domain and the logic in each domain are identified to the emulator, the simulator, or the in-circuit emulator. When the power to the display memory goes off, the data in the memory is randomized. While running a series of tests on the phone in the emulator/simulator, the display memory may be read out and displayed as a image on a workstation. Randomizing the display memory will appear like snow on a TV while the memory is powered off until it is rewritten with the original data prior to the randomization. Buts in the phone design may be found when the data is rewritten, and/or when the image is redrawn on the display.

Some user designs have a low-power mode where the memory still has the correct data in it, but cannot be read while the power is low. This situation is modeled by the present invention by temporarily changing the random number S from S1 to S2 while in the low-power state and then putting S back to S1 when full power is restored.

According to one embodiment, memory writes to the memory during a low-power state may be modeled in several ways depending on the actual memory operation. If memory writes during a low-power state have no effect, the model forces the write enable (WE) inactive during the low-power state. If memory writes during a low-power state work correctly, the model writes the memory using the stored S1 instead of S. If memory writes during a low-power state corrupt any memory location, i.e., the value stored in that memory location is not predictable or recoverable, the model writes the memory using a third random number S3 instead of the original random number S. If any memory write to the memory during a low-power corrupts the whole memory the model forces WE inactive during the low-power state, remembers that there has been a write and does not set S back to S1 when full power is restored.

FIG. 1 illustrates a schematic for reading a memory with single read/write port, according to one embodiment. Random key generator 201 receives power signal 101 indicating the power state of the user design and generates a random number S. Encryptor 202 receives memory address 102 and the random number S from random number generator 201, and generates an encryption key K. Each time the power signal 101 is received, Random key generator 201 determines whether to generate a new random number or return the stored random number depending on the current power and test status. For example, for decoding the already encoded memory data, the stored random number S is returned. Alternatively encryptor 202 returns the stored key K for memory data decoding without generating the key K again.

Read/write signal 104 determines whether to read or write to the memory address 102. For writing to the memory address 102 at memory 204, read/write signal 104 is set to zero, and write data 103 is XOR'ed with the encryption key K at XOR block 203. The output from the XOR block 203 is the input data DI 105 to the memory 204. The input data DI is written to the memory address 102 of the memory 204. For reading data from the memory address 102 at memory 204, read/write signal 104 is set to one, and the data from memory address 102 from memory 204 is put on data out DO 106. The output data DO 106 is XOR'ed at the XOR block 205 with the same encryption key K. The read data 110 is compared with the original write data 103 to perform the memory read/write test in a power-off or a low-power condition. If the original write data 103 before the encryption and the read data 110 after the decryption do not match, it is concluded that an error occurred during the memory read and/or write.

The present technique completely and efficiently randomizes memory within an emulation clock. Therefore, the memory randomization is done at a full speed without requiring any intervention by a state machine or the randomization routines running in the host workstation.

The invention provides a solution for a logic analyzer mode and can also be used as a better solution for STB mode. In a logic analyzer (LA) mode, the running emulation cannot be stopped once it starts because the model is connected to an external logic that will crash if the clock runs too slow or stop. In a STB mode, no external logic is connected, or the external logic can be stopped without causing a crash. In a STB mode, the running emulation can be stopped by effectively freezing time for the circuit under test. For randomizing a memory, the emulation is stopped and a random value is written to the target memory locations, and the emulation resumes where it is left off. The present invention facilitates the pause/resume operations for memory randomization during the emulation and completes the emulation more efficiently and faster.

In one embodiment, the memory is randomized using a state machine requiring that the user design waits for an instruction to finish and raise a power good signal to move onto the next test. This randomization may be performed without generating encryption keys unique for each memory address.

In another embodiment, a tag identifying when the memory was written is saved and made available to continue the test. When the memory data is read, if the tag does not match the current power state, the memory is substituted with random data. The random data may be generated using a state machine or encryption key generated in accordance with the present technique.

A method and system for accelerating memory randomization in a functional verification test of a user design is disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

I claim:

1. A computer-implemented method for randomizing data that can be stored in a memory portion of a user design that is undergoing functional verification testing prior to manufacture using a functional verification testing system, wherein the user design can operate in a plurality of power states, including a first power state and a lower power state, comprising:
   receiving a power signal indicating a change of power state of the user design undergoing functional verification to the lower power state;
   generating a random number in response to the power signal;

receiving a plurality of memory addresses of a memory in the user design undergoing functional verification;

storing a first set of data in the plurality of memory addresses;

calculating a first set of encryption keys unique for each memory address of the plurality of memory addresses of the memory in the user design undergoing functional verification by performing an operation using the random number and the corresponding memory address; and writing a second set of data to the plurality of memory addresses by encrypting the first set of data with the first set of encryption keys unique for each memory address.

2. The computer-implemented method of claim 1 further comprising:

reading the second set of data from the plurality of memory addresses of the memory after the one or more power domains is turned off or run in the lower power state;

generating a third set of data for each memory address of the memory by decrypting the second set of data using the first set of encryption keys for each memory address.

3. The computer-implemented method of claim 2 further comprising:

comparing the first set of data and the third set of data for each memory address of the plurality of memory addresses in the memory.

4. The computer-implemented method of claim 3 further comprising:

concluding that an error occurred during the steps of the writing the second set of data and/or the reading the second set of data to and/or from the plurality of memory addresses of the memory if the first set of data and the third set of data do not match.

5. The computer-implemented method of claim 1, wherein the first set of encryption keys is calculated by an exclusive OR (XOR) operation between the random number and each memory address.

6. The computer-implemented method of claim 1 further comprising:

generating a second random number in a single test cycle with a linear feedback shift register (LFSR); and calculating a second set of encryption keys unique for each memory address of the plurality of memory addresses of the memory in the user design undergoing functional verification by performing an operation using the second random number and the corresponding memory address.

7. The computer-implemented method of claim 1, wherein the random number and the first set of encryption keys have different width.

8. The computer-implemented method of claim 7, wherein the step of generating a first set of encryption keys further comprising inverting, shifting and/or rotating selected bits in each memory address of the plurality of memory addresses based on selected set of bits from the random number.

9. The computer-implemented method of claim 7, wherein the user design models a mobile phone.

10. The computer-implemented method of claim 1, wherein the functional verification system is a hardware-based emulation system, further comprising:

programming the user design into the hardware-based emulation system that comprises a plurality of emulation resources.

11. The computer-implemented method of claim 1, wherein the memory in the user design undergoing functional verification testing is programmed into a hardware-based emulation system that comprises a plurality of emulation resources, and wherein the hardware-based emulation system is the functional verification testing system.

12. A non-transitory computer-readable storage medium having stored thereon a plurality of instructions, said plurality of instructions when executed by a computer, cause said computer to perform:

generating a random number in response to a power signal during a functional verification test of a user design undergoing functional verification, wherein the functional verification test is performed prior to manufacture using a functional verification testing system, and wherein the user design can operate in a plurality of power states, including a first power state and a lower power state;

receiving the power signal indicating a change of power state of the user design undergoing functional verification to the lower power state;

receiving a plurality of memory addresses of a memory in the user design;

storing a first set of data in the plurality of memory addresses;

calculating a first set of encryption keys unique for each memory address of the plurality of memory addresses of the memory in the user design undergoing functional verification by performing an operation using the random number and the corresponding memory address; and writing a second set of data to the plurality of memory addresses by encrypting the first set of data with the first set of encryption keys unique for each memory address.

13. The non-transitory computer-readable storage medium of claim 12 having stored thereon a plurality of instructions, said plurality of instructions when executed by a computer, cause said computer to further perform:

reading the second set of data from the plurality of memory addresses of the memory after the one or more power domains is turned off or run in the lower power state;

generating a third set of data for each memory address of the memory by decrypting the second set of data using the first set of encryption keys for each memory address.

14. The non-transitory computer-readable storage medium of claim 13 having stored thereon a plurality of instructions, said plurality of instructions when executed by a computer, cause said computer to further perform:

comparing the first set of data and the third set of data for each memory address of the plurality of memory addresses in the memory.

15. The non-transitory computer-readable storage medium of claim 14 having stored thereon a plurality of instructions, said plurality of instructions when executed by a computer, cause said computer to further perform:

concluding that an error occurred during the steps of the writing the second set of data and/or the reading the second set of data to and/or from the plurality of memory addresses of the memory if the first set of data and the third set of data do not match.

16. The non-transitory computer-readable storage medium of claim 12, wherein the first set of encryption keys is calculated by an exclusive OR (XOR) operation between the random number and each memory address.

17. The non-transitory computer-readable storage medium of claim 12 having stored thereon a plurality of instructions, said plurality of instructions when executed by a computer, cause said computer to further perform:

generating a second random number in a single test cycle with a linear feedback shift register (LFSR); and calculating a second set of encryption keys unique for each memory address of the plurality of memory addresses of the memory in the user design undergoing functional verification by performing an operation using the second random number and the corresponding memory address.

18. The non-transitory computer-readable storage medium of claim 12, wherein the random number and the first set of encryption keys have different width.

19. The non-transitory computer-readable storage medium of claim 18, wherein the step of generating a first set of encryption keys further comprising inverting, shifting and/or rotating selected bits in each memory address of the plurality of memory addresses based on selected set of bits from the random number.

20. The non-transitory computer-readable storage medium of claim 18, wherein the user design models a mobile phone.

21. The non-transitory computer-readable storage medium of claim 12 having stored thereon a plurality of instructions, said plurality of instructions when executed by a computer, cause said computer to further perform:
    programming the user design into a hardware-based emulation system that comprises a plurality of emulation resources, and wherein the hardware-based emulation system is the functional verification testing system.

22. The non-transitory computer-readable storage medium of claim 12, wherein the memory in the user design undergoing functional verification testing is programmed in a hardware-based emulation system that comprises a plurality of emulation resources, and wherein the hardware-based emulation system is the functional verification testing system.

23. A system for randomizing data that can be stored in a memory portion of a user design that is undergoing functional verification testing prior to manufacture using a functional verification testing system, wherein the user design can operate in a plurality of power states, including a first power state and a lower power state, the system comprising:
    a random number generator for generating a random number in response to a power state signal indicating a change of power state of the user design undergoing functional verification to the lower power state, wherein the random number generator receives the power state signal from the user design or from a computer performing the functional verification testing;
    a memory in a user design undergoing functional verification having a plurality of memory addresses;
    an encrypter for calculating based on the power state signal a first set of encryption keys unique for each memory address of the plurality of memory addresses by performing an operation using the random number and the corresponding memory address of the memory in the user design undergoing functional verification;
    an encrypting circuit for encrypting data in the plurality of memory addresses using the first set of encryption keys; and
    a decrypting circuit for decrypting data read from the plurality of memory addresses using the first set of encryption keys,
    wherein each encryption key of the first set of encryption keys are unique for each memory address.

24. The system for randomizing data of claim 23 wherein the user design and the memory in the user design is programmed in a hardware-based emulation system that comprises a plurality of emulation resources, and wherein the hardware-based emulation system is the functional verification testing system.

* * * * *